United States Patent
Wallin et al.

(10) Patent No.: US 12,532,548 B2
(45) Date of Patent: Jan. 20, 2026

(54) PHOTOVOLTAIC TOP MODULE

(71) Applicant: First Solar, Inc., Tempe, AZ (US)

(72) Inventors: Erik Wallin, Uppsala (SE); Olle Lundberg, Uppsala (SE); Lars Stolt, Uppsala (SE)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 18/011,439

(22) PCT Filed: Jun. 24, 2021

(86) PCT No.: PCT/EP2021/067273
§ 371 (c)(1),
(2) Date: Dec. 19, 2022

(87) PCT Pub. No.: WO2021/260084
PCT Pub. Date: Dec. 30, 2021

(65) Prior Publication Data
US 2023/0268452 A1    Aug. 24, 2023

(30) Foreign Application Priority Data
Jun. 26, 2020 (SE) .................... 2050778-6

(51) Int. Cl.
*H10F 19/40* (2025.01)
*H10F 19/80* (2025.01)
(Continued)

(52) U.S. Cl.
CPC ........... *H10F 19/40* (2025.01); *H10F 19/807* (2025.01); *H10F 19/902* (2025.01); *H10F 71/1375* (2025.01); *H10K 85/50* (2023.02)

(58) Field of Classification Search
CPC ....... H01L 31/00–078; Y02E 10/50–60; H10F 10/00–19; H10F 19/00–908; H10F 77/00–959
(Continued)

(56) References Cited

U.S. PATENT DOCUMENTS 8,247,682 B2    8/2012    Feldman-Peabody
8,816,185 B2    8/2014    Casler et al.
(Continued)

FOREIGN PATENT DOCUMENTS

WO    WO-2015148637 A1 * 10/2015 ..... H01L 31/022425
WO    WO-2019/013630 A1    1/2019
(Continued)

OTHER PUBLICATIONS

International Search Report and Written Opinion, Application No. PCT/EP2021/067273, dated Sep. 24, 2021.
(Continued)

*Primary Examiner* — Bach T Dinh
(74) *Attorney, Agent, or Firm* — MacMillan, Sobanski & Todd, LLC

(57) ABSTRACT

In accordance with one or more embodiments herein, a method of manufacturing a photovoltaic (PV) top module, to be used together with a PV bottom module, e.g an SI-based PV bottom module, is provided. The method may include monolithically interconnecting a plurality of thin film based PV sub-cells, manufactured using a perovskite material and/or a CIGS material as solar absorbing material, in series on a substrate in order to create a PV top module including at least one first PV top sub-module, and arranging metal grid lines on top and bottom contact layers of the PV top module. The metal grid lines may be arranged either above or below the top and bottom contact layers of the PV top module.

8 Claims, 11 Drawing Sheets

(51) Int. Cl.
*H10F 19/90* (2025.01)
*H10F 71/00* (2025.01)
*H10K 85/50* (2023.01)

(58) Field of Classification Search
USPC .................................................. 136/243–265
See application file for complete search history.

(56) References Cited

U.S. PATENT DOCUMENTS

| | | | |
|---|---|---|---|
| 9,147,794 B2 | 9/2015 | Feldman-Peabody et al. | |
| 10,128,393 B2 | 11/2018 | Cohen et al. | |
| 2008/0099063 A1* | 5/2008 | Armstrong | H01L 31/048 |
| | | | 136/249 |
| 2010/0200043 A1 | 8/2010 | Lombardo et al. | |
| 2012/0204939 A1 | 8/2012 | Lee et al. | |
| 2014/0202515 A1 | 7/2014 | Haase | |
| 2014/0209149 A1* | 7/2014 | Mascarenhas | H01L 31/0687 |
| | | | 438/74 |
| 2014/0246070 A1* | 9/2014 | Karg | H10F 19/31 |
| | | | 136/244 |
| 2015/0340528 A1 | 11/2015 | Alberi et al. | |
| 2017/0323993 A1 | 11/2017 | Björk et al. | |
| 2019/0148574 A1* | 5/2019 | Saive | H01L 31/022433 |
| | | | 136/256 |

FOREIGN PATENT DOCUMENTS

| | | |
|---|---|---|
| WO | WO-2019/104653 A1 | 6/2019 |
| WO | WO-2019/164443 A1 | 8/2019 |
| WO | WO-2019/164444 A1 | 8/2019 |

OTHER PUBLICATIONS

Park Nam-Gyu et al., "Scalable fabrication and coating methods for perovskite solar cells and solar modules," Nature Reviews Materials, Nature ublishing Group UK, London, vol. 5, No. 5, Feb. 19, 2020, pp. 333-350.

* cited by examiner

PHOTOVOLTAIC TOP MODULE

CROSS-REFERENCE TO PRIOR APPLICATIONS

This application is a § 371 National Stage Application of PCT International Application No. PCT/EP2021/067273 filed Jun. 24, 2021, which claims priority to Swedish Patent Application No. 2050778-6 filed Jun. 26, 2020, both of which are incorporated herein in their entirety.

TECHNICAL FIELD

The present disclosure relates generally to photovoltaic (PV) top modules, to be used together with PV bottom modules for creating tandem PV modules, and methods for manufacturing PV top modules.

BACKGROUND

PV modules commonly comprise Si-based PV sub-cells as solar cells. However, there is a limit to the efficiency that may be achieved using Si-based PV sub-cells. Thin film based PV sub-cells and modules are sometimes used in order to e.g. reduce manufacturing costs, reduce the weight, or achieve other specific product features such as e.g. bendability or more visually appealing appearance.

Solar cells may be combined into PV modules in different ways. A multi-junction PV module, where the light passes more than one semiconductor pn-junction, generally comprises at least two types of PV cells that are stacked on top of each other. A multi-junction PV module where the light passes two types of PV cells that are stacked on top of each other is generally called a tandem PV module. A tandem PV module can be achieved e.g. by combining two types of materials directly on each individual cell (so called monolithic tandems), or by stacking two different types of PV sub-modules on top of each other.

US20120204939 and US2010 0200043 both describe tandem thin film based PV modules, where both of the PV sub-modules are thin film based PV sub-modules.

US20170323993 describes a hybrid photovoltaic device comprising a thin film solar cell disposed in a first layer that is series connected with a Si-based bulk solar cell disposed in a second layer, positioned below the first layer. It is proposed that the thin film solar cell and the bulk solar cell may alternatively act as two separate systems, with four leads out producing power separately.

US2014202515, US20150340528 and WO2019013630 all describe stacked configurations where thin film solar cells are combined with Si-based solar cells.

Problems with the Prior Art

The concept of stacking two thin film based PV sub-modules on top of each other to create tandem thin film based PV modules that are more efficient than Si-based PV modules is well known, as evidenced by e.g. US20120204939 and US2010 0200043. However, Si-based PV modules are still the most common type of PV modules, for cost and manufacturing reasons. Manufacturers of Si-based PV modules are looking for improvements of Si-based PV modules, not replacement of Si-based PV modules with thin film based PV modules.

US20170323993, US2014202515, US20150340528 and WO2019013630 describe different ways of increasing the efficiency of an Si-based PV module by combining the Si-based solar cells with thin film based solar cells.

These types of solutions have so far not had their commercial break-through, for several reasons. In order for the efficiency of a tandem module to be significantly increased compared to a single junction module, a thin film absorber material with high efficiency at a suitable band gap is needed. The PV module installation costs at the same time need to be kept low, and for the technology to be useful, the integration of the thin film technology into the existing Si manufacturing infrastructure needs to be cost-effective and simple. This can be achieved by connecting a thin-film module in parallel with the Si module. However, this becomes difficult when using high efficiency absorber materials with relatively high band gap, since monolithic interconnection requires quite narrow thin film based PV sub-cells, in order for the parasitic resistive power loss not to be too large. This makes the voltage matching when connecting the thin film module in parallel to a Si module more difficult, since for a thin film module to have the same width as a Si module, there will be a much larger number of thin film based PV sub-cells than there are Si-based PV sub-cells in the Si module.

There is thus a need for improved PV modules.

SUMMARY

The above described problem is addressed by the claimed method for manufacturing a PV top module, to be used together with a PV bottom module, e.g. an Si-based PV bottom module. The method may comprise monolithically interconnecting a plurality of thin film based PV sub-cells, manufactured using a perovskite material and/or a CIGS material as solar absorbing material, in series on a substrate in order to create a PV top module comprising at least one first PV top sub-module, and arranging metal grid lines on top and bottom contact layers of the PV top module. The metal grid lines may be arranged either above or below the top and bottom contact layers.

Such a PV top module may e.g. be used as an add-on to a regular Si-based PV bottom module, in order to increase the efficiency of the Si-based PV bottom module. When the PV top module is used together with a PV bottom module in a tandem PV module, the two sub-modules absorb different wavelengths of the incoming light, and a much higher efficiency than for a regular Si-based PV module is enabled. Some perovskite materials and some CIGS materials have a band gap that make them very suitable for combining with an Si-based PV bottom module into a tandem PV module. The arrangement of metal grid lines on top and bottom contact layers of the PV top module makes it possible to achieve a lower output voltage of the PV top module without any major loss in efficiency, so that for the same module size, the PV top module may have a similar output voltage as an Si-based PV bottom module, which is necessary if the PV top module and the PV bottom module are to be connected in parallel. The metal grid lines improve the conductivity of the electrode material arranged on the thin film layer of the thin film based PV sub-cells, and thereby enable the use of wider thin film based PV sub-cells.

In embodiments, the method further comprises defining the metal grid lines using a photolithography method. This is a cost-efficient way of arranging the metal grid lines, which also allows for very narrow grid lines, thereby minimizing the shadowing of the solar cells. The metal grid lines may however alternatively be deposited in other ways, such as e.g. using screen-printing, or by deposition through a shadow mask.

In embodiments, the method further comprises aligning the metal grid lines of the top and bottom contact layers of the PV top module with each other. This reduces the loss in efficiency due to grid shadowing. The alignment does not have to be perfect—as long as at least a part of the grid lines are aligned, such as e.g. half the grid line width, this will reduce grid shadowing.

In embodiments, the method further comprises coating the PV top module on the inside of a cover glass for a PV bottom module, using the cover glass as the substrate. This is a very cost-efficient way of creating the PV top module, since a PV bottom module anyhow needs to have a cover glass.

In embodiments, the method further comprises manufacturing the thin film based PV sub-cells to be semi-transparent, preferably by being as transparent as possible for photon energies below the band gap of the solar absorbing material used in the thin film based PV sub-cells. In this way, the incoming light that is not absorbed by the thin film based PV sub-cells will be able to reach the Si-based PV sub-cells.

In embodiments, the method comprises monolithically interconnecting a plurality of thin film based PV sub-cells, manufactured using a perovskite material and/or a CIGS material as solar absorbing material, in series on the substrate, in an area beside the first PV top sub-module, in order to create at least one additional PV top sub-module beside the first PV top sub-module, and connecting each additional PV top sub-module in parallel with the first PV top sub-module within the PV top module.

The above described problem is also addressed by the claimed manufacturing arrangement for manufacturing the above described PV top module. The claimed manufacturing arrangement may be adapted to perform any one of the above described methods.

The above described problem is further addressed by the claimed method for manufacturing a PV module comprising the above described PV top module. The method may comprise: series connecting a plurality of Si-based PV sub-cells in order to create a PV bottom module; stacking the above described PV top module on the PV bottom module; and connecting the PV bottom module and the PV top module in parallel within the PV module, so that the PV module only comprises two output terminals.

In embodiments, the PV top module and the PV bottom module are laminated together.

In embodiments, the arranging of the metal grid lines comprises aligning the metal grid lines on the top and/or bottom contact layers of the PV top module with metal grid lines on the Si-based PV sub-cells of the PV bottom module. The alignment does not have to be perfect—as long as at least a part of the grid lines are aligned, such as e.g. half the grid line width, this will reduce grid shadowing In embodiments, the method further comprises adapting the cell width of the monolithically integrated PV sub-cells in order to adjust the output voltage of the PV top module to be similar to the output voltage of a typical PV bottom module. A typical Si-based sub-cell with crystalline Si has an output voltage of about 0.5-0.7 V, and a number of such Si-based sub-cells are typically connected in series into a Si-based PV bottom module having an output voltage of about 30-50 V. Since the PV top module and the PV bottom module are preferably connected in parallel, they preferably have similar output voltages. This may be achieved by adapting the cell width of the monolithically integrated thin film PV sub-cells in the PV top module (thereby affecting the total number of thin film PV sub-cells in series), e.g. to a cell width of 10-40 mm, preferably 20-30 mm, for a module width of 80-120 cm. With a standard cell width of the monolithically integrated thin film PV sub-cells of about 5 mm, the output voltage of a thin film based PV top module is normally much higher than 30-50 V. This is especially true for perovskite materials and CIGS materials suitable for being combined with Si-based PV bottom modules, as they are high-efficiency high band gap absorbers where the monolithic interconnection requires quite narrow thin film based PV sub-cells, in order for the parasitic resistive power loss not to be too large. For such materials, it is difficult to match the voltage of the thin film top module with that of a crystalline Si bottom module, since for a thin film module to have the same width as a Si module, there will be a much larger number of thin film based PV sub-cells than there are Si-based PV sub-cells in the Si module. The metal grid lines improve the conductivity of the electrode material arranged on the thin film layer of the thin film based PV sub-cells, and thereby enable the use of wider thin film based PV sub-cells.

The above described problem is also addressed by the claimed PV top module. The claimed PV top module may comprise a plurality of series connected thin film based PV sub-cells, manufactured using a perovskite material and/or a CIGS material as solar absorbing material, that are monolithically integrated on a substrate in order to create a PV top module comprising at least one first PV top sub-module, with metal grid lines arranged on top and bottom contact layers of the PV top module. The metal grid lines may be arranged either above or below the top and bottom contact layers. The PV top module may be configured to be stackable onto a PV bottom module, in order to create a PV module with a PV top module and a PV bottom module, connected in parallel within the PV module, so that the PV module only comprises two output terminals. Such a PV top module may be used as an add-on to a regular Si-based PV module by a manufacturer of regular Si-based PV modules, to enable a much higher efficiency than for a regular Si-based PV module, since the PV top module and the PV bottom module absorb different wavelengths of the incoming light.

The metal grid lines allow for wider monolithically interconnected thin film solar cells, which reduces the number of cells for a given area. The smaller number of cells makes it possible to achieve a lower output voltage of the PV top module without any major loss in efficiency, so that for the same width, the PV top module and the PV bottom module may have similar output voltages.

In embodiments, the metal grid lines have been defined using a photolithography method. This is a cost-efficient way of arranging the metal grid lines, which also allows for very narrow grid lines, thereby minimizing the shadowing of the solar cells. The metal grid lines may however alternatively be deposited in other ways, such as e.g. using screen-printing or by deposition through a shadow mask.

In embodiments, the metal grid lines on the top and bottom contact layers of the PV top module are aligned with each other. This reduces the loss in efficiency due to grid shadowing. The alignment does not have to be perfect—as long as at least a part of the grid lines are aligned, such as e.g. half the grid line width, this will reduce grid shadowing.

In embodiments, the substrate for the PV top module is a cover glass for a PV bottom module, and the PV top module is coated on the inside of this cover glass. This is a very cost-efficient way of creating the PV top module, since an Si-based PV bottom module anyhow needs a cover glass.

In embodiments, the thin film based PV sub-cells are semi-transparent, preferably by being as transparent as possible for photon energies below the band gap of the solar absorbing material used in the thin film based PV sub-cells. In this way, the incoming light that is not absorbed by the thin film based PV sub-cells will be able to reach the Si-based PV sub-cells.

In embodiments, the PV top module further comprises at least one additional PV top sub-module, where each additional PV top sub-module comprises a number of series connected thin film based PV sub-cells that are monolithically integrated on a thin film substrate, and all the PV top sub-modules are connected in parallel within the PV top module. This achieves a sectioned thin film PV top module, where each of the thin film based PV top sub-modules may be arranged to have the same output voltage as a typical Si-based PV bottom module, while keeping the cell width more narrow.

In embodiments, the cell width of the monolithically integrated thin film PV sub-cells has been adapted in order to adjust the output voltage of the PV top module to be similar to the output voltage of a typical PV bottom module. A typical Si-based sub-cell with crystalline Si has an output voltage of about 0.5-0.7 V, and a number of such Si-based sub-cells are typically connected in series into a Si-based PV bottom module having an output voltage of about 30-50 V. Since the PV top module and the PV bottom module are preferably connected in parallel, they preferably have similar output voltages. This may be achieved by the cell width of the monolithically integrated thin film PV sub-cells in the PV top module having been adapted (thereby affecting the total number of thin film PV sub-cells in series), e.g. to a cell width of 10-40 mm, preferably 20-30 mm, for a module width of 80-120 cm. With a standard cell width of the monolithically integrated thin film PV sub-cells of about 5 mm, the output voltage of a thin film based PV top module is normally much higher than 30-50 V. This is especially true for perovskite materials and CIGS materials suitable for being combined with Si-based PV bottom modules, as they are high-efficiency high band gap absorbers where the monolithic interconnection requires quite narrow thin film based PV sub-cells, in order for the parasitic resistive power loss not to be too large. For such materials, it is difficult to match the voltage of the thin film top module with that of a crystalline Si bottom module, since for a thin film module to have the same width as a Si module, there will be a much larger number of thin film based PV sub-cells than there are Si-based PV sub-cells in the Si module. The metal grid lines improve the conductivity of the electrode material arranged on the thin film layer of the thin film based PV sub-cells, and thereby enable the use of wider thin film based PV sub-cells.

The metal grid lines may be arranged in any suitable pattern, as long as they connect the thin film based PV sub-cells with each other. If the thin film based PV sub-cells are arranged in a row, the metal grid lines may simply be one or more lines across the row of thin film based PV sub-cells.

The above described problem is further addressed by the claimed PV module. The PV module may comprise a PV bottom module, comprising a plurality of series connected Si-based PV sub-cells, and the above described PV top module, coated on the inside of a cover glass for the PV bottom module, wherein the PV bottom module and the PV top module are connected in parallel within the PV module, so that the PV module only comprises two output terminals.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
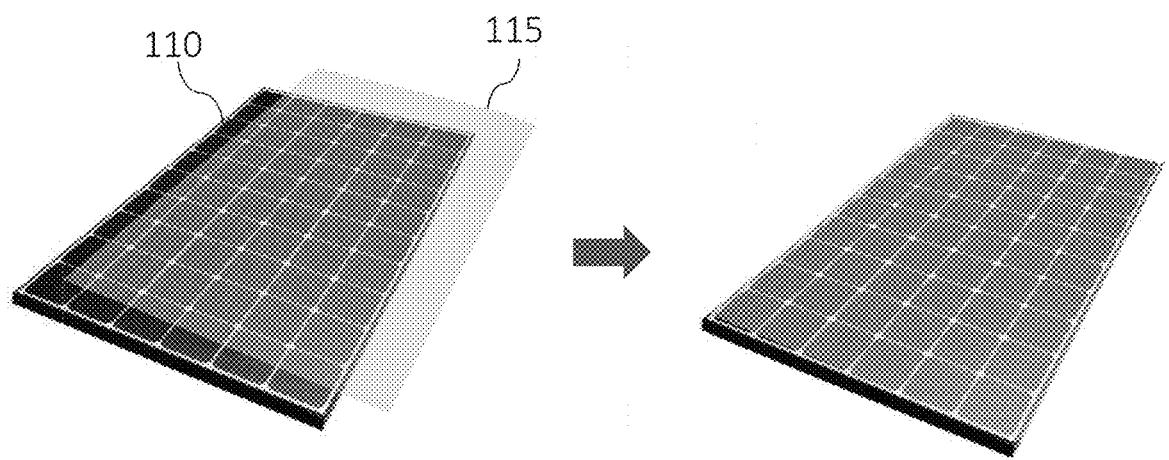
FIGS. 1*a-c* schematically illustrate example embodiments of PV modules, in accordance with one or more embodiments described herein.

The present disclosure relates generally to PV top modules, and methods for manufacturing PV top modules. Embodiments of the disclosed solution are presented in more detail in connection with the figures.

According to the disclosure, a PV bottom module comprising Si-based PV sub-cells is connected in parallel with a PV top module comprising thin film based PV sub-cells. In this way, a regular PV bottom module comprising Si-based PV sub-cells and a cover glass may be used, by simply arranging a thin film based PV top module on the inside of the cover glass. The thin film based PV top module may also be called a PV power booster, since it boosts the power of the Si-based PV bottom module. This may significantly increase the efficiency of the Si-based PV bottom module, possibly by up to 50%. The solar absorbing material of the thin film based PV sub-cells is preferably a perovskite material and/or a CIGS material.

A perovskite material is a material with a three-dimensional crystal structure related to that of $CaTiO_3$, or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (1/2, 1/2, 1/2) and the X anions are at (1/2, 1/2, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. The symmetry of a perovskite comprising more than one A cation, more than one B cation or more than one X cation, will be lower than that of $CaTiO_3$. A large number of different elements can form perovskite crystal structures. Perovskites that may be used as solar absorbing material in PV applications are typically inorganic-organic halide perovskites where [A] is typically methylammonium, formamidinium or Cs (or a mixture of these), [B] is typically Pb or Sn (or a mixture of these), and [X] is typically one or more elements from the halogen group, such as e.g. I, Br or Cl.

A CIGS material is a material in the material class chalcogenides having a crystal structure of the type chalcopyrite. CIGS materials may be represented by the formula $Cu_x(In_{1-y},Ga_y)Se_2$, where x and y may be varied. The value of x should preferably be close to 1, such as e.g. between 0.7 and 0.95, but is preferably not higher than 1. Different values of y give different band gap in the material. It is possible to substitute some of the Cu with Ag, and such a CIGS material (sometimes called ACIGS) may be represented by the formula $(Cu_{1-z},Ag_z)_x(In_{1-y},Ga_y)Se_2$. The Se may also, partly or completely, be replaced with S, and the In and/or Ga may, partly or completely, be replaced with Al. Moreover, small amounts of other elements, such as for example alkali metals (Na, K, Rb, Cs), may also be added.

The band gap of the Si material of the PV bottom module is normally 1.1 eV. In order for the efficiency of the tandem module to be as high as possible, it is advantageous if the band gap of the solar absorbing material in the thin film PV top module is higher than 1.3 eV, and more preferably higher than 1.5 eV. Both perovskites and CIGS-based materials can be synthesized to have band gaps in this range, while maintaining a high conversion efficiency, by tuning their composition appropriately. These materials are therefore particularly suitable to be used as solar absorbing material in the disclosed thin film based PV top module.

FIG. 1a schematically illustrates a PV module comprising a transparent protective cover glass 115 arranged on an Si-based PV bottom module 110. The cover glass 115 may e.g. be a low-iron glass, which has a lower infrared absorption than regular glass. The cover glass 115 may have an antireflecting coating on the outside, and possibly also a barrier coating for alkali metals such as Na on the inside. The cover glass 115 may be hardened and faceted around the edges, since this improves sustainability. The cover glass 115 may be surface structured in a suitable way, e.g. in an orange peel structure or a faceted structure. The cover glass 115 may e.g. be Pilkington Optiwhite™ glass.

Figure 1B:
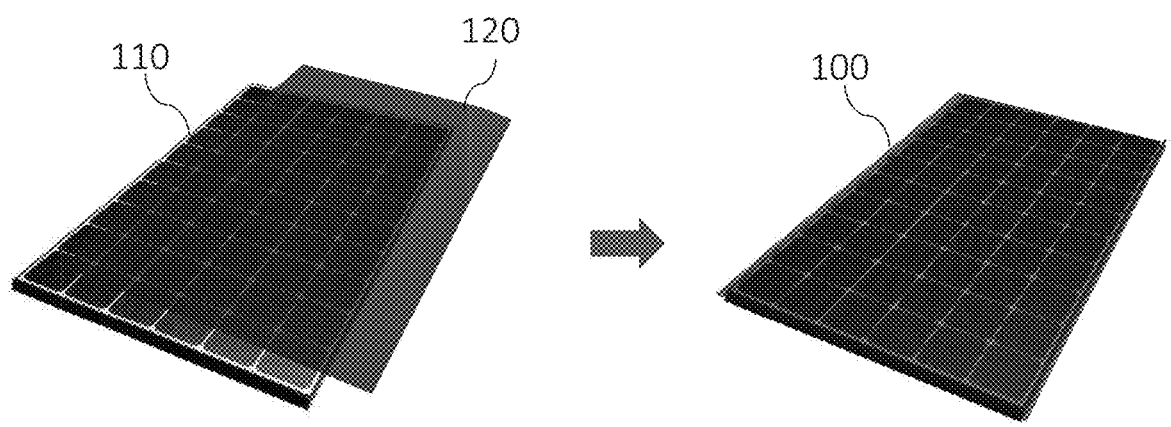

FIG. 1b schematically illustrates an example embodiment of a PV module 100 comprising an Si-based PV bottom module 110, where a thin film based PV top module 120 has been arranged on the inside of a transparent protective cover glass 115. The PV top module 120 and the PV bottom module 110 are preferably laminated together.

Figure 1C:
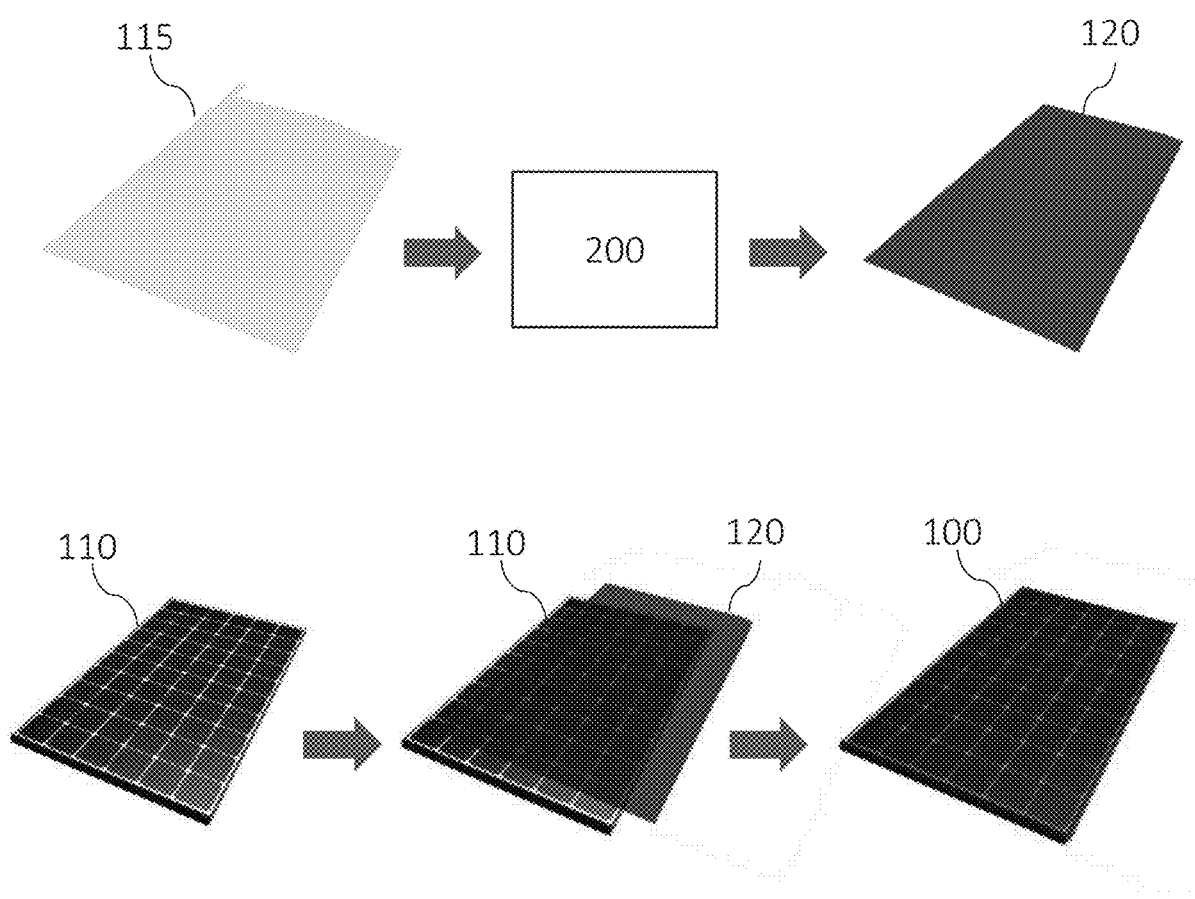

FIG. 1c schematically illustrates the arrangement of a thin film based PV top module 120 on the inside of a transparent protective cover glass 115, in a production line 200, before the cover glass 115 is laminated to an Si-based PV bottom module 110 in order to create a PV module 100.

Figure 2A:
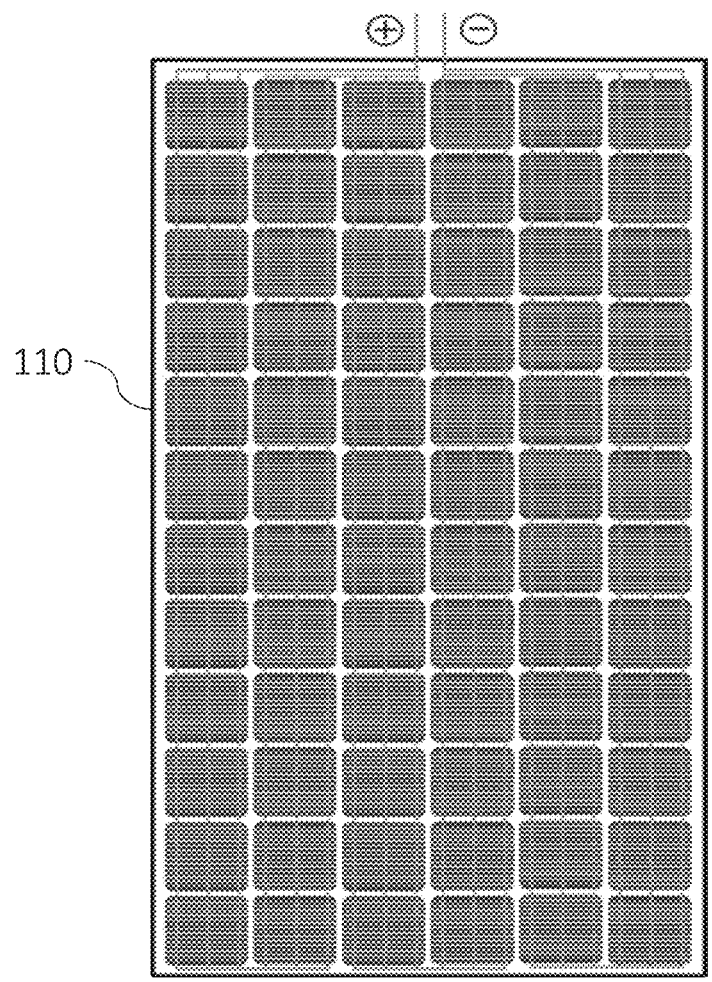
FIG. 2*a* schematically illustrates an example embodiment of an Si-based PV bottom module, in accordance with one or more embodiments described herein.

FIG. 2a schematically illustrates an example embodiment of an Si-based PV bottom module 110 comprising a plurality of series connected Si-based PV sub-cells. The Si-based PV sub-cells are preferably arranged in a matrix, as illustrated in FIG. 2a.

Figure 2B:
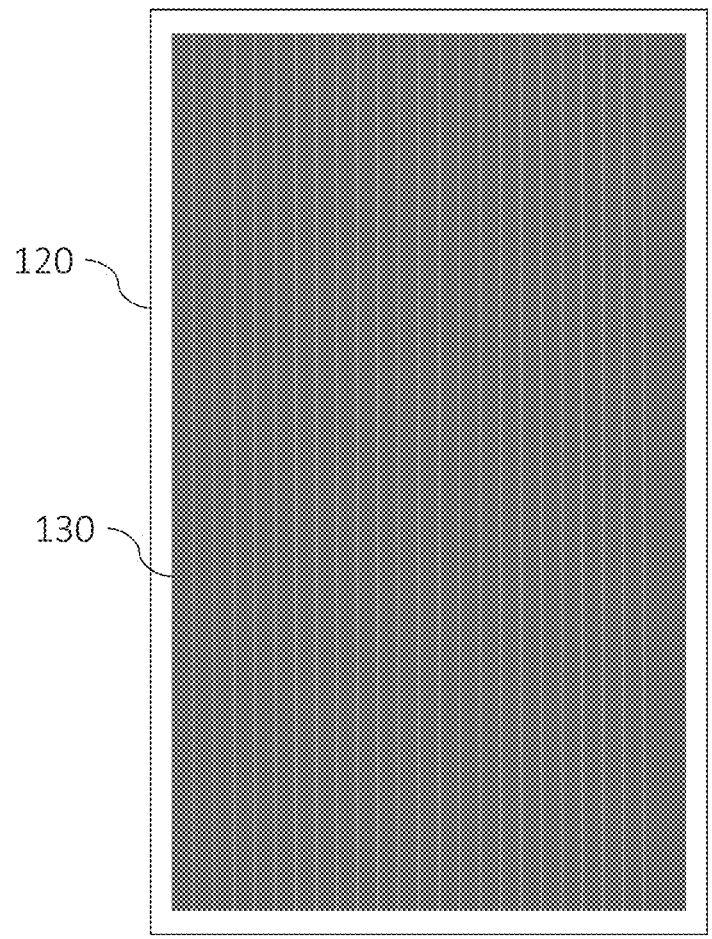
FIGS. 2*b-c* schematically illustrate example embodiments of PV top modules, in accordance with one or more embodiments described herein.

FIG. 2b schematically illustrates an example embodiment of a thin film based PV top module 120 comprising a plurality of series connected thin film based PV sub-cells that are monolithically integrated on a thin film substrate 115. The thin film based PV sub-cells are preferably arranged in a row, as illustrated in FIG. 2b, to form a first PV top sub-module 130, which may comprise the entire PV top module 120. The solar absorbing material of the thin film based PV sub-cells is preferably a perovskite material and/or a CIGS material.

A PV module 100 may comprise such an Si-based PV bottom module 110 and such a thin film based PV top module 120, where the thin film based PV top module 120 is stacked onto the Si-based PV bottom module 110, and the Si-based PV bottom module 110 and thin film based PV top module 120 are connected in parallel within the PV module 100. This means that the PV module 100 only comprises two output terminals. The cell width of the monolithically integrated thin film based PV sub-cells may be adapted in order to adjust the output voltage of the thin film based PV top module 120 to be similar to the output voltage of the Si-based PV bottom module 110, e.g. to a cell width of 10-40 mm, preferably 20-30 mm, for a module width of 80-120 cm.

A typical Si-based sub-cell with crystalline Si has an output voltage of about 0.5-0.7 V, and a number of such Si-based sub-cells are typically connected in series into an Si-based PV bottom module 110 having an output voltage of about 30-50 V. Since the PV top module 120 and the PV bottom module 110 are preferably connected in parallel, they preferably have similar output voltages. This may be achieved by adapting the cell width of the monolithically integrated thin film PV sub-cells in the PV top module 120 (thereby affecting the total number of thin film PV sub-cells in series). With a standard cell width of the monolithically integrated thin film PV sub-cells of about 5 mm, the output voltage of a thin film based PV top module 120 is normally much higher than 30-50 V. This is especially true for perovskite materials and CIGS materials suitable for being combined with Si-based PV bottom modules, as they are high-efficiency high band gap absorbers where the monolithic interconnection requires quite narrow thin film based PV sub-cells, in order for the parasitic resistive power loss not to be too large. For such materials, it is difficult to match the voltage of the thin film PV top module 120 with that of the Si PV bottom module 110, since for a thin film PV top module 120 to have the same width as a Si PV bottom module 110, there will be a much larger number of thin film based PV sub-cells than there are Si-based PV sub-cells in the Si PV bottom module 110. The metal grid lines improve the conductivity of the electrode material arranged on the thin film layer of the thin film based PV sub-cells, and thereby enable the use of wider thin film based PV sub-cells. The metal grid lines may be arranged either above or below the electrode material arranged on the thin film layer of the thin film based PV sub-cells.

Figure 2C:
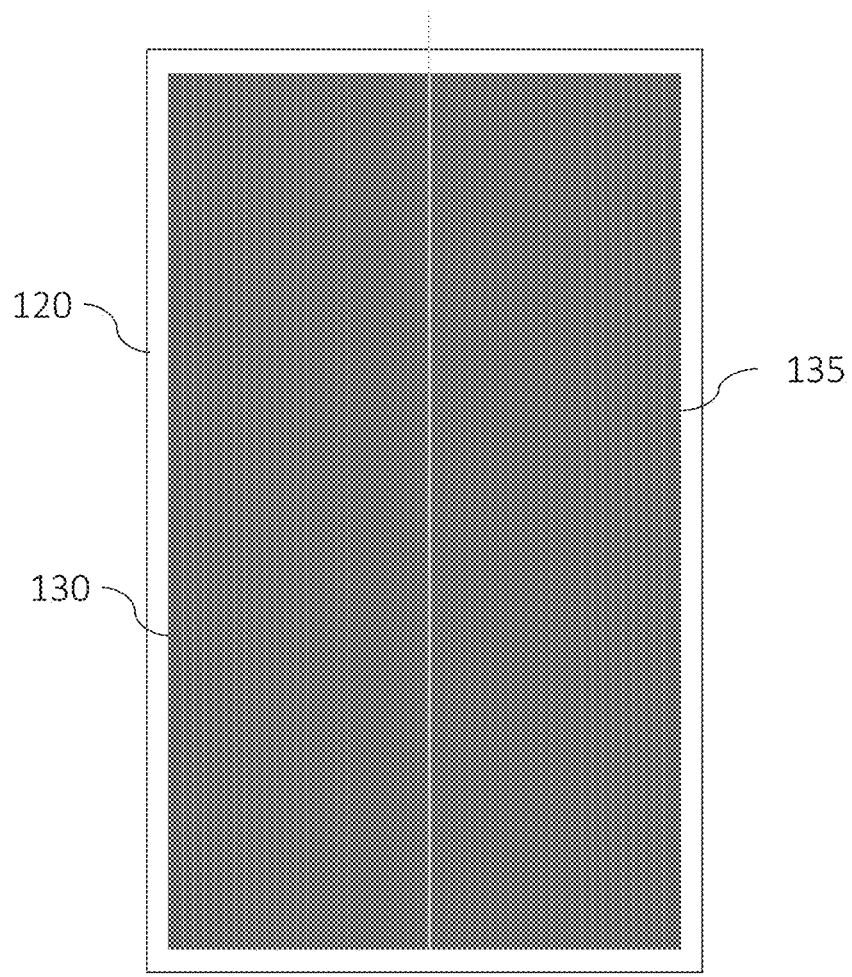

FIG. 2c schematically illustrates an example embodiment of a sectioned thin film based PV top module 120, comprising two parallel connected thin film based PV top sub-modules 130, 135, each comprising a plurality of series connected thin film based PV sub-cells that are monolithically integrated on a thin film substrate 115. Both PV top sub-modules 130, 135 are preferably arranged on the same thin film substrate 115, in areas beside each other. In this way, each of the thin film based PV top sub-modules 130, 135 may be arranged to have the same output voltage as the Si-based PV bottom module, while keeping the cell width more narrow.

A PV module 100 may comprise any number of such parallel connected thin film based PV top sub-modules 130, 135, each connected in parallel with the Si-based PV bottom module 110 within the PV module 100. This means that the PV module 100 only comprises two output terminals. In this way, each of the thin film based PV top sub-modules 130, 135 may be arranged to have the same output voltage as the Si-based PV bottom module 110. At the boundary between the thin film based PV top sub-modules 130, 135, there may be a non-active region (so called dead area). Such a dead area is preferably aligned with an existing dead area of the Si-based PV bottom module 110.

Figure 3:
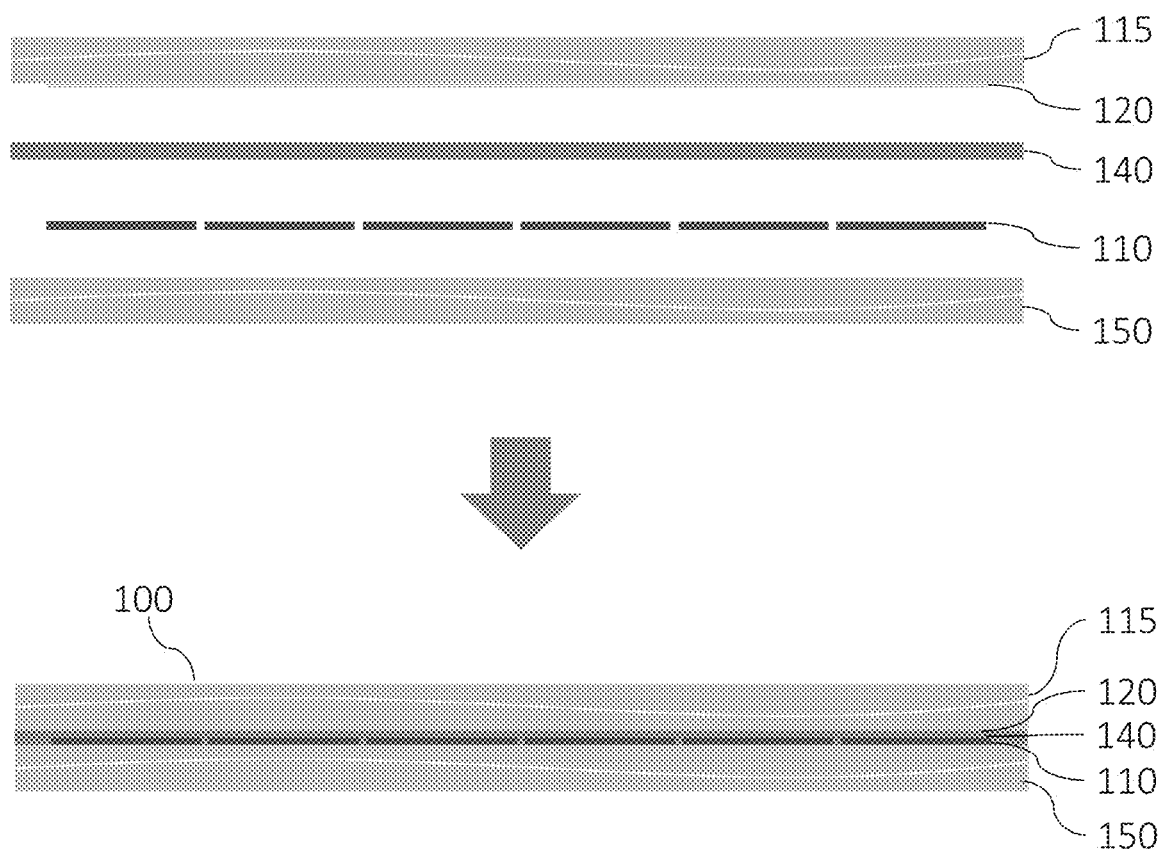
FIG. 3 schematically illustrates a cross-section of an example layout of a PV module, in accordance with one or more embodiments described herein.

FIG. 3 schematically illustrates a cross-section of an example layout of a PV module 100. A thin film based PV top module 120 is coated on a substrate 115, preferably a cover glass. The thin film based PV top module 120 is preferably semi-transparent, preferably by being as transparent as possible for photon energies below the band gap of the solar absorbing material used in the thin film based PV sub-cells. A lamination polymer 140, e.g. EVA or PVB or polyolefine, is preferably arranged between the thin film based PV top module 120 and an Si-based PV bottom module 110. On the other side of the Si-based PV bottom module 110, a sheet of glass or backsheet foil 150 is preferably arranged.

FIGS. 4-6 schematically illustrate the manufacturing of different embodiments of a thin film based PV top module 120, including the creation of monolithic interconnections between thin film based PV sub-cells. The creation of the monolithic interconnections may e.g. involve scraping the surface with a needle, or laser scribing, e.g. as described in the article "Scalable fabrication and coating methods for perovskite solar cells and solar modules" by Park et. al., Nature Reviews Materials (2020), vol. 5, p. 333-350.

In each of the illustrated embodiments, a top contact layer is created by a first layer of a transparent electrode material 124 being arranged onto the substrate 115 before the thin film layer 125 is arranged, and a bottom contact layer is created by a second transparent electrode material 126 being arranged onto the thin film layer 125. The transparent electrode materials 124, 126 are preferably transparent conducting oxide (TCO) materials such as e.g. indium tin oxide (ITO), doped zinc oxide (e.g. ZnO:Al) or doped indium oxide (e.g. $In_2O_3$:Zn, $In_2O_3$:W, or $In_2O_3$:H), and the layers 124, 126 may thus be called TCO layers. In order to separate the thin film based PV sub-cells from each other, isolation is arranged between the thin film based PV sub-cells, and between the TCO layers 124, 126 on different thin film based PV sub-cells. Further, connecting contacts 122 are arranged in order to series connect the thin film based PV sub-cells with each other.

In the embodiments schematically illustrated in FIGS. 4a-b and 5a-b, first isolation recesses are created after arranging the first TCO layer 124 on the substrate 115. When the thin film layer 125 is arranged onto the first TCO layer 124, it is applied also in the first isolation recesses, thus creating isolation between the first TCO layer 124 of different thin film based PV sub-cells.

Figure 6A:
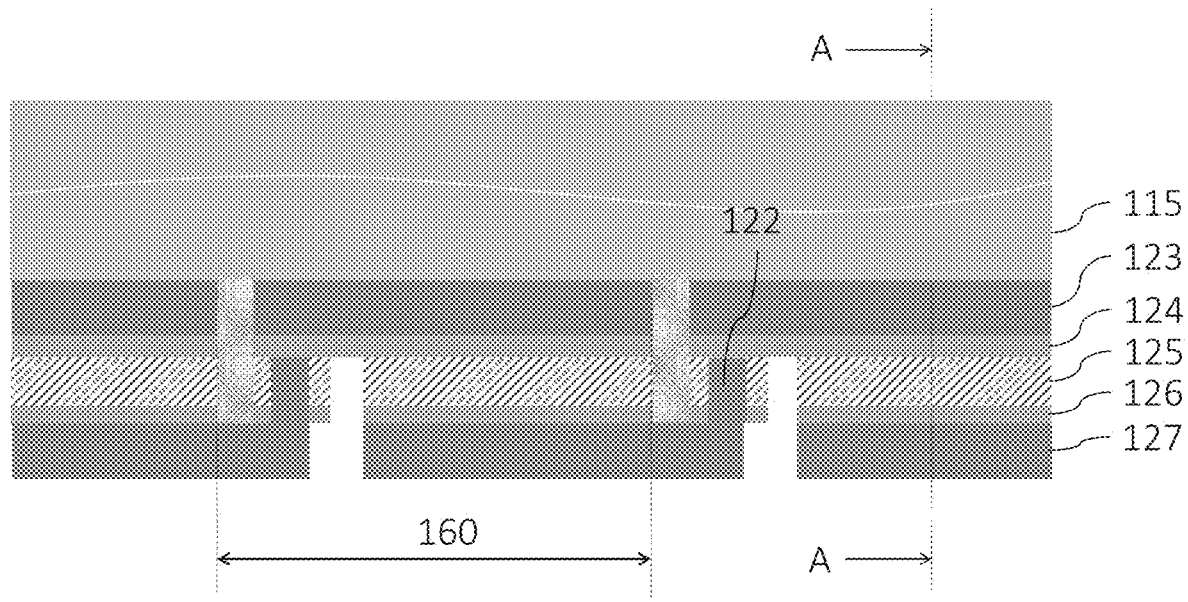
Figure 6B:
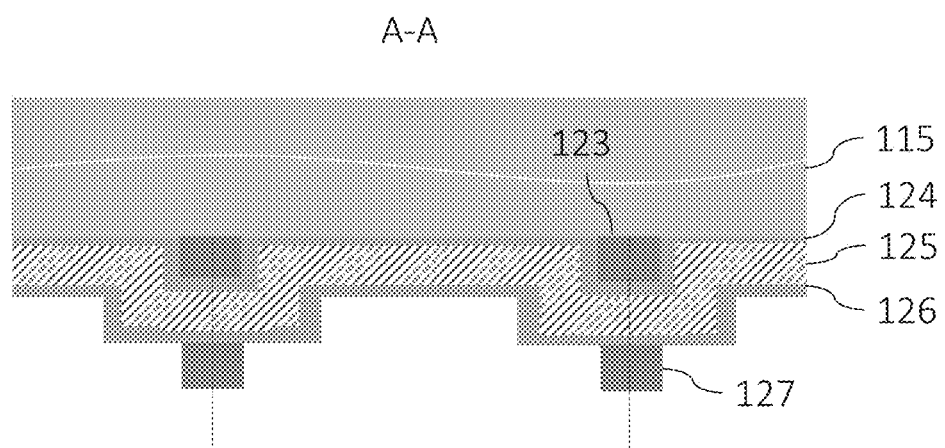

In the embodiment schematically illustrated in FIGS. 6a-b, the first isolation recesses are instead created after arranging the thin film layer 125 on the first TCO layer 124. The first isolation recesses are then filled with an isolating material, thus creating isolation between different thin film based PV sub-cells, before the second TCO layer 126 is arranged onto the thin film layer 125.

Figure 4A:
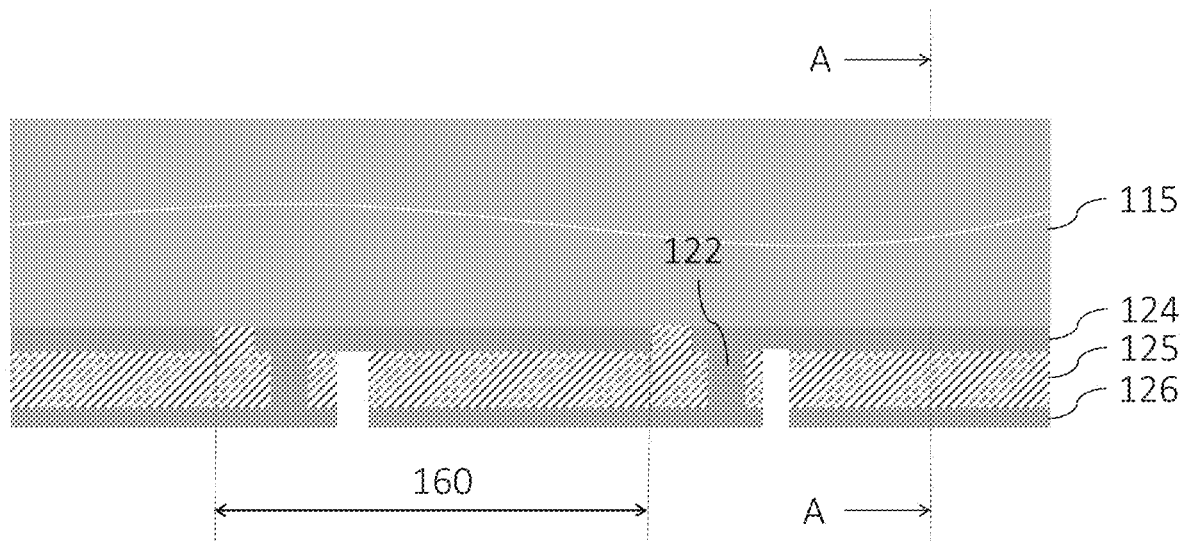
FIGS. 4-6 schematically illustrate the manufacturing of different embodiments of a thin film based PV top module, including the creation of monolithic interconnections between thin film based PV sub-cells, in accordance with one or more embodiments described herein.
Figure 4B:
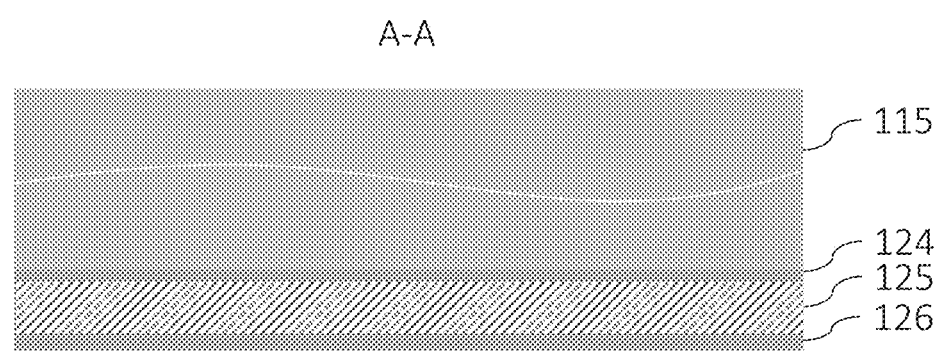

In the embodiment schematically illustrated in FIGS. 4a-b, contacting recesses are created in the thin film layer 125. When the second TCO layer 126 is arranged onto the thin film layer 125, it is applied also in the contacting recesses, thus creating connecting contacts 122 between different thin film based PV sub-cells. Second isolation recesses are then created in the second TCO layer 126 and the thin film layer 125.

There is always a trade-off between the conductivity and the transparency of the TCO layers 124, 126. To avoid resistive losses when using wide cells in the thin film based PV top module 120, the TCO layers 124, 126 would have to be very thick and thereby have a lower transparency, which leads to reduced solar cell efficiency. To overcome these difficulties, metal grid lines 123, 127 are arranged on the top 124 and bottom 126 contact layers of the PV top module 120, in order to allow for wider cells and thereby lower the output voltage of the thin film based PV top module 120 without any major loss in efficiency. The metal grid lines 123, 127 may be arranged either above or below the top 124 and bottom 126 contact layers of the PV top module 120. The metal grid lines 123, 127 improve the conductivity of the top 124 and bottom 126 contact layers of the PV top module 120, and thereby enable the use of wider thin film based PV sub-cells. The metal grid lines 123, 124 may e.g. be defined using a photolithography method, and they are preferably aligned with each other, in order to reduce the loss caused by the shadowing of the grid lines. The alignment does not have to be perfect—as long as at least a part of the grid lines are aligned, such as e.g. half the grid line width, this will reduce grid shadowing. The photolithography method may e.g. be the photolithography method described in WO2019164444 or WO2019164443, but other photolithography methods may also be used. The metal grid lines may alternatively be deposited in other ways, such as e.g. using screen-printing or by deposition through a shadow mask. In addition, since the Si-based cells of the Si-based PV bottom module 110 typically also have grid lines, it is advantageous if the grid lines of the thin film based PV top module 120 are at least partly aligned with the grid lines on the Si-based cells of a typical Si-based PV bottom module 110.

In the embodiments schematically illustrated in FIGS. 5a-b and 6a-b, metal grid lines 123, 127 are arranged on both sides of the TCO layers 124, 126. Thus, before the first TCO layer 124 is arranged onto the substrate 115, a first metal layer 123 is arranged. The first isolation recesses are thus created through also the metal layer 123. The metal grid lines 123, 127 may alternatively be arranged on the inside of the TCO layers 124, 126. Thus, each metal grid line 123, 127 may be arranged on either side of the respective TCO layer 124, 126.

In the embodiments schematically illustrated in FIGS. 6a-b, contacting recesses are created in the second TCO layer 126 and the thin film layer 125 when the second TCO layer 126 has been arranged onto the thin film layer 125. When the second metal layer 127 is arranged onto the second TCO layer 126, it is applied also in the contacting recesses, thus creating connecting contacts 122 between different thin film based PV sub-cells.

Figure 5A:
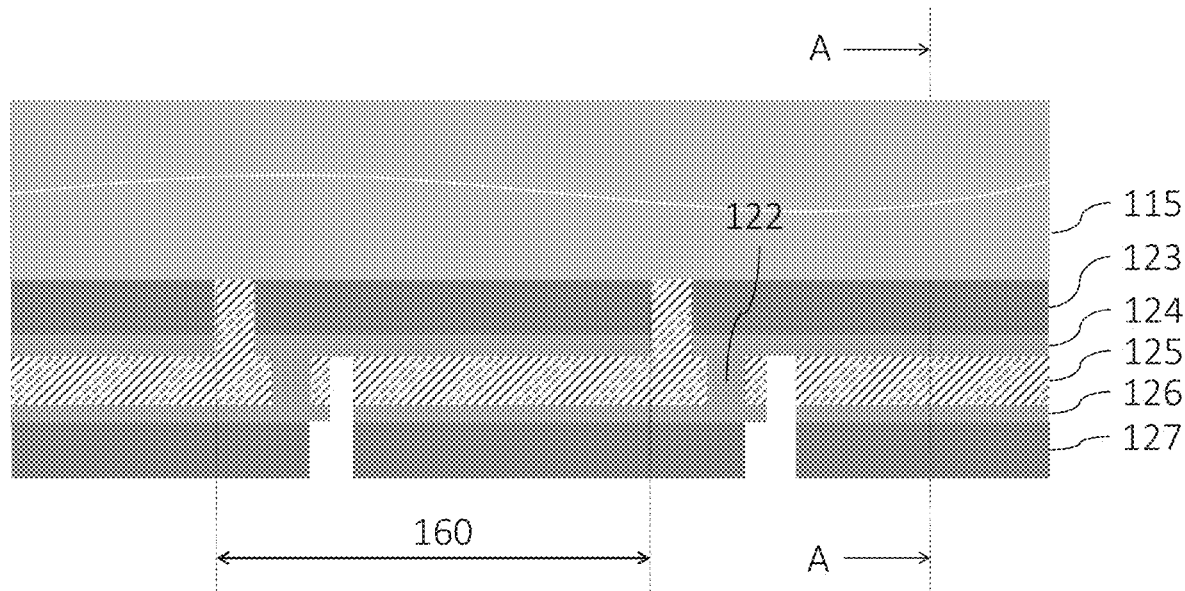
Figure 5B:
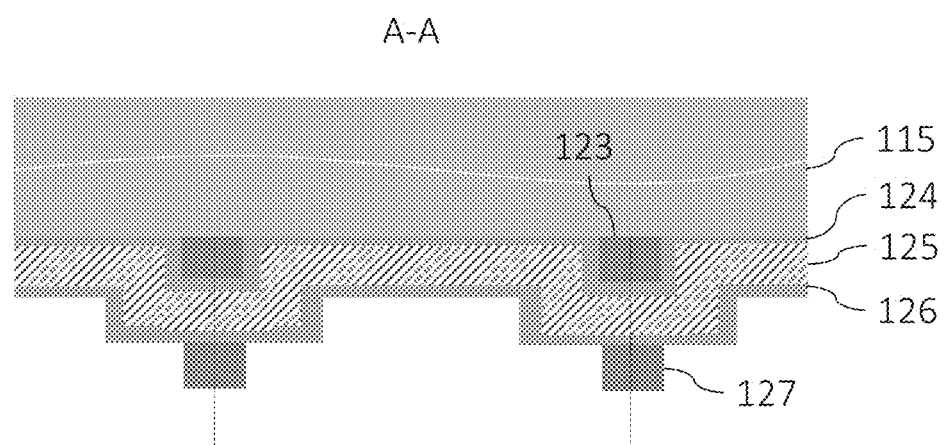

In the embodiment schematically illustrated in FIGS. 5a-b, contacting recesses are instead created in the thin film layer 125 before the second TCO layer 126 is arranged onto the thin film layer 125. When the second TCO layer 126 is arranged onto the thin film layer 125, it is applied also in the contacting recesses, thus creating connecting contacts 122 between different thin film based PV sub-cells. The second metal layer 127 is then arranged onto the second TCO layer 126.

In the embodiments schematically illustrated in FIGS. 5a-b and 6a-b, second isolation recesses are finally created in the metal layer 127, the second TCO layer 126 and the thin film layer 125.

The metal layers 123, 127 are preferably arranged in the form of metal grid lines 123, 127. This may be achieved e.g. using photolithography. It is preferred for the metal grid lines 123, 127 to be aligned with each other in order to reduce the loss in efficiency due to grid shadowing. The alignment does not have to be perfect—as long as at least a part of the metal grid lines 123, 127 are aligned, such as e.g. half the grid line width, this will reduce grid shadowing. The photolithography method may e.g. be the photolithography method described in WO2019164444 or WO2019164443, but other photolithography methods may also be used. The metal grid lines may however alternatively be deposited in other ways, such as e.g. using screen-printing or by deposition by PVD or evaporation in vacuum through a shadow mask.

The metal grid lines may be arranged in any suitable pattern, as long as they connect the thin film based PV sub-cells with each other. If the thin film based PV sub-cells are arranged in a row, as illustrated in FIGS. 2b-c, the metal grid lines may simply be one or more lines across the row of thin film based PV sub-cells.

In addition to the layers illustrated in FIGS. 4-6, the PV top module 120 may comprise further layers, such as e.g. a hole transport layer (HTL) and/or an electron transport layer (ETL). Perovskite solar cells comprising such further layers are described in the article "The rapid evolution of highly efficient perovskite solar cells" by Correa-Baena et. al., Energy Environ. Sci. (2017), 10, p. 710-727. A large number of different combinations of such layers is described in the article "A review on perovskite solar cells: Evolution of architecture, fabrication techniques, commercialization issues and status" by Roy et. al., Solar Energy (2020), vol. 198, p. 665-688.

Figure 7:
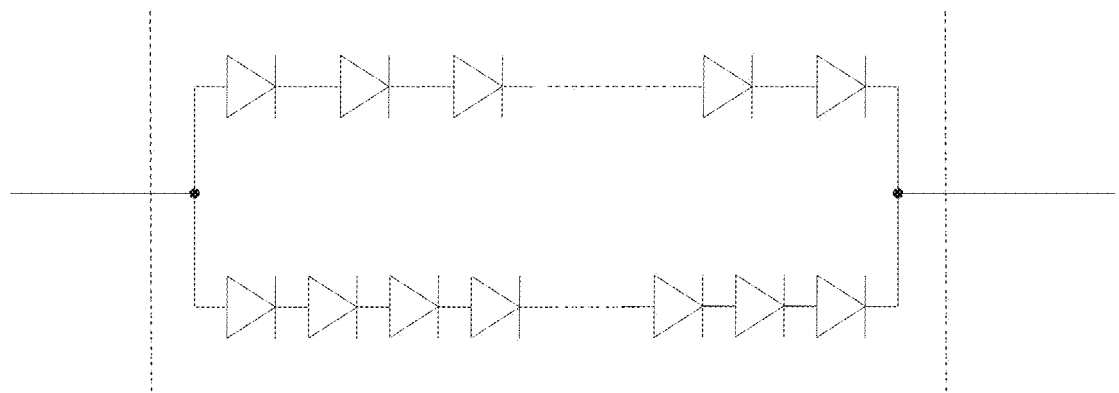
FIGS. 7 and 8 show principal electrical drawings of example embodiments of a PV module, in accordance with one or more embodiments described herein.
Figure 8:
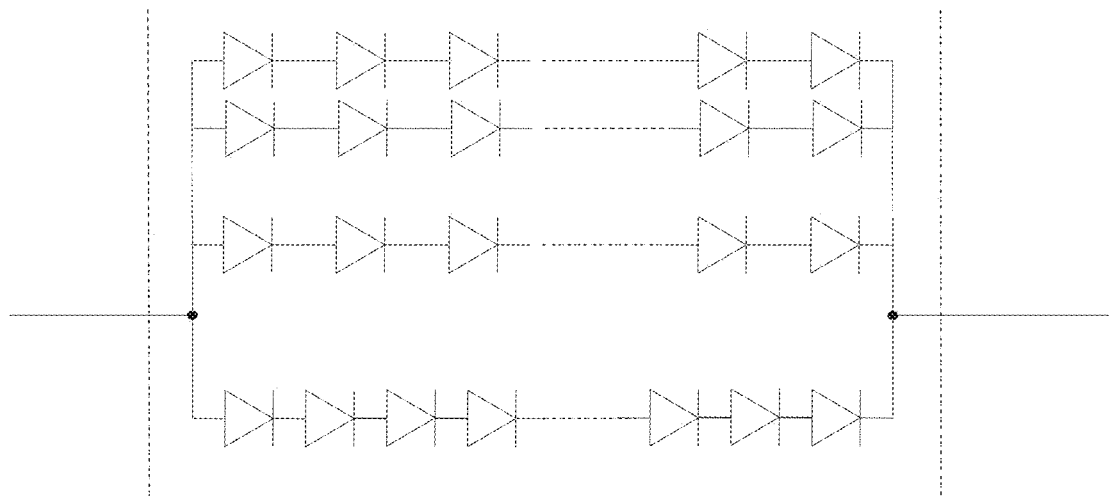

FIGS. 7 and 8 show principal electrical drawings of example embodiments of a PV module 100, in accordance with one or more embodiments described herein.

FIG. 7 illustrates that the number of thin film based PV sub-cells (solar cells) is preferably selected so that the output voltage from the thin film based PV sub-cells of the thin film based PV top module 120 matches that of the Si-based PV sub-cells of the Si-based PV bottom module 110, in order not to lose efficiency when connecting the two in parallel. The top line illustrates the thin film based PV top module 120 and the bottom line illustrates the Si-based PV bottom module 110.

FIG. 8 illustrates an alternative solution using a sectioned thin film based PV top module 120 comprising a number of thin film based PV top sub-modules 130, 135, as illustrated above in FIG. 2c. The number of thin film based PV sub-cells (solar cells) in each thin film based PV top sub-module 130, 135 is preferably selected so that the output voltage from the thin film based PV sub-cells of the thin film based PV top sub-module 130, 135 matches that of the Si-based PV sub-cells of the Si-based PV bottom module 110, in order not to lose efficiency when connecting the two in parallel. The top lines illustrate a number of such thin film based PV top sub-modules 130, 135, and the bottom line illustrates the Si-based PV bottom module. Such an embodiment allows each of the thin film based PV top sub-modules 130, 135 in the sectioned thin film based PV top module 120 to be arranged to have the same output voltage as a typical Si-based PV bottom module 110, while keeping the cell width 160 more narrow.

Figure 9:
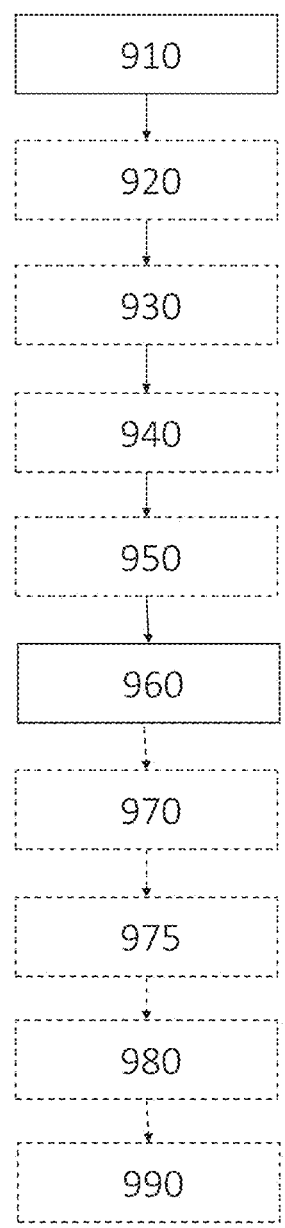
FIG. 9 schematically illustrates a method for manufacturing a PV top module, in accordance with one or more embodiments described herein.

FIG. 9 schematically illustrates a method 900 for manufacturing a PV top module 120 to be used together with a PV bottom module 110, in accordance with one or more embodiments described herein. The method 900 may comprise:

Step 910: monolithically interconnecting a plurality of thin film based PV sub-cells, manufactured using a perovskite material and/or a CIGS material as solar absorbing material, in series on a substrate 115 in order to create a PV top module 120 comprising at least one first PV top sub-module 130.

Step 960: arranging metal grid lines 123, 127 on top 124 and bottom 126 contact layers of the PV top module 120. The metal grid lines 123, 127 may be arranged either above or below the top 124 and bottom 126 contact layers.

The arranging 960 of the metal grid lines may comprise defining the metal grid lines 123, 127 using a photolithography method. The arranging 960 may comprise aligning the metal grid lines 123, 127 on the top 124 and bottom 126 contact layers of the PV top module 120 with each other. The alignment does not have to be perfect—as long as at least a part of the grid lines are aligned, such as e.g. half the grid line width, this will reduce grid shadowing.

The method 900 may further comprise one or more of:

Step 920: coating the PV top module 120 on the inside of a cover glass 115 for a PV bottom module 110, using the cover glass as the substrate 115.

Step 930: manufacturing the thin film based second PV sub-cells to be semi-transparent, preferably by being as transparent as possible for photon energies below the band gap of the solar absorbing material used in the thin film based PV sub-cells.

Step 940: monolithically interconnecting a plurality of thin film based PV sub-cells, manufactured using a perovskite material and/or a CIGS material as solar absorbing material, in series on a substrate 115, in an area beside the first PV top sub-module 130, in order to create at least one additional PV top sub-module 135 beside the first PV top sub-module 130.

Step 950: connecting each additional PV top sub-module 135 in parallel with the first PV top sub-module 130 within the PV top module 120.

Step 970: series connecting a plurality of Si-based PV sub-cells in order to create a PV bottom module 110.

Step 975: adapting the cell width 160 of the thin film based monolithically integrated PV sub-cells in order to adjust the output voltage of the PV top module 120 to be similar to the output voltage of the PV bottom module 110, e.g. to a cell width 160 of 10-40 mm, preferably 20-30 mm, for a module width of 80-120 cm.

Step 980: stacking the PV top module 120 on the PV bottom module 110.

Step 990: connecting the PV bottom module 110 and the PV top module 120 in parallel to thereby create a PV module 100, where the PV module 100 only comprises two output terminals.

In such a method, the arranging 960 of the metal grid lines may comprise aligning the metal grid lines 123, 127 on the top 124 and/or bottom 126 contact layers of the PV top module 120 with metal grid lines on the Si-based PV sub-cells of the PV bottom module 110. The alignment does not have to be perfect—as long as at least a part of the grid lines are aligned, such as e.g. half the grid line width, this will reduce grid shadowing.

The first PV top module 120 and the PV bottom module 110 are preferably laminated together.

Some of these steps are in practice carried out simultaneously. For example, steps 920, 930 and 940 are typically carried out simultaneously with step 910.

The above described method 900 may be performed by an arrangement comprising automation tools for e.g. placing, interconnecting, and/or stringing Si solar cells, thin film deposition equipment utilizing technologies like e.g. sputtering, thermal evaporation, e-beam evaporation, atomic layer deposition, chemical vapor deposition and/or different chemical solution-based approaches, and tools for patterning the thin films using e.g. mechanical and/or laser scribing. If a metal grid is used, the arrangement may further comprise equipment for depositing a metal grid e.g. using photolithography, screen-printing or by deposition through a shadow mask. The arrangement may further comprise tools for laminating the sub-modules together, and/or various tools for testing the resulting PV modules.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure. The disclosure describes a number of different embodiments, but further embodiments are of course also covered by the scope of the claims. Further, the steps may be carried out in any order that makes technical sense, and some steps may be carried out simultaneously. Accordingly, the scope of the invention is defined only by the claims.

The invention claimed is:

1. A photovoltaic (PV) module comprising:
   a PV top module comprising a plurality of series connected thin film based PV sub-cells, wherein the thin film based PV sub-cells comprise a perovskite material and/or a CIGS material as solar absorbing material, the thin film based PV sub-cells are monolithically integrated on a substrate forming the PV top module, wherein the PV top module comprises at least one first PV top sub-module, with metal grid lines arranged on top and bottom contact layers of the PV top module; and
   a PV bottom module having a plurality of series connected Si-based PV sub-cells, wherein the PV bottom module and the PV top module are connected in parallel within the PV module, and wherein the PV module comprises no more than two output terminals;
   wherein an output voltage of the PV top module is in a range of 30 V to 50 V, and an output voltage of the PV bottom module is in a range of 30 V to 50 V;
   wherein each of the thin film based PV sub-cells has a cell width in a range from 20 mm to 30 mm;
   wherein each of the PV top module and the PV bottom module has a module width in a range from 80 cm to 120 cm.

2. The PV module according to claim 1, wherein the metal grid lines have been defined using a photolithography method.

3. The PV module according to claim 1, wherein the metal grid lines on the top and bottom contact layers of the PV top module are aligned with each other.

4. The PV module according to claim 1, wherein the thin film based PV sub-cells are semi-transparent.

5. The PV module according to claim 1, further comprising at least one additional PV top sub-module, where each additional PV top sub-module comprises a number of series connected thin film based third PV sub-cells that are monolithically integrated on a thin film substrate, and all the PV top sub-modules are connected in parallel within the PV top module.

6. The PV module according to claim 1, wherein the PV top module is coated on the inside of a cover glass for the PV bottom module.

7. The PV module according to claim 1, wherein the metal grid lines arranged on top and bottom contact layers of the PV top module are aligned with metal grid lines on the PV bottom module, whereby the gridlines overlap over at least one half of a gridline width.

8. The PV module according to claim 6, wherein the PV top module comprises a perovskite material.

* * * * *